United States Patent [19]

Jiang

[11] 4,308,594
[45] Dec. 29, 1981

[54] MOS MEMORY CELL

[75] Inventor: Ching-Lin Jiang, Dallas, Tex.

[73] Assignee: Mostek Corporation, Carrollton, Tex.

[21] Appl. No.: 117,223

[22] Filed: Jan. 31, 1980

[51] Int. Cl.³ .................... G11C 11/40; G11C 11/24
[52] U.S. Cl. .................................... 365/187; 365/149
[58] Field of Search .............................. 365/149, 187

[56] References Cited

U.S. PATENT DOCUMENTS

| | | | |
|---|---|---|---|
| 3,618,053 | 11/1971 | Hudson et al. | 365/187 |
| 3,744,037 | 7/1973 | Spence | 365/149 |
| 3,876,993 | 4/1975 | Cavanaugh | 365/149 |
| 3,878,404 | 4/1975 | Walther et al. | 365/149 |
| 3,967,252 | 6/1976 | Donnelly | 365/149 |
| 4,091,460 | 5/1978 | Schuermeyer et al. | 365/149 |
| 4,125,854 | 11/1978 | McKenny et al. | 365/132 |

OTHER PUBLICATIONS

Caywood et al., "A Novel 4K Static RAM with Submilliwatt Standby Power," IEEE Trans. on Electron Dev., vol. ED-26, No. 6, 6/79, pp. 861-864.
Cilingiroglu", A Charge-Pumping-Loop Concept for Static MOS/RAM Cells", IEEE Jour. of Solid-State Cir., vol. SC-14, No. 3, 6/79, pp. 599-603.

Primary Examiner—Stuart N. Hecker
Attorney, Agent, or Firm—Richards, Harris & Medlock

[57] ABSTRACT

An integrated circuit memory cell (10) having a bit line (12), a word line (14) and a cell voltage supply (26) is provided. The integrated circuit memory cell (10) includes a first clock line (34) and a second clock line (36). A first transistor (20) is interconnected to the bit line (12) and the word line (14) for providing access to the memory cell (10). A second transistor (22) is interconnected to the cell voltage supply source (26) and to the first transistor (20) thereby defining a first node (S). The second transistor (22) provides a charging path from the cell voltage supply source (26) to the first node (S). A capacitor (30) is provided and interconnects the first clock line (34) and the second transistor (22). The interconnection between the capacitor (30) and the second transistor (22) defines a second node (K). The capacitor (30) provides a coupling path between the first clock line (34) and the second node (K) for conditionally supplying a voltage from the first clock line (34) to the second node (K) to render voltage at the second node (K) higher than the cell voltage supply source (26). A third transistor is provided for the memory cell (10) and is interconnected to the first node (S) and the second node (K) and the second clock line (36). The third transistor (24) provides a charging path between the second clock line (36) and the second node (K) for conditionally maintaining a voltage at the second node (K).

14 Claims, 3 Drawing Figures

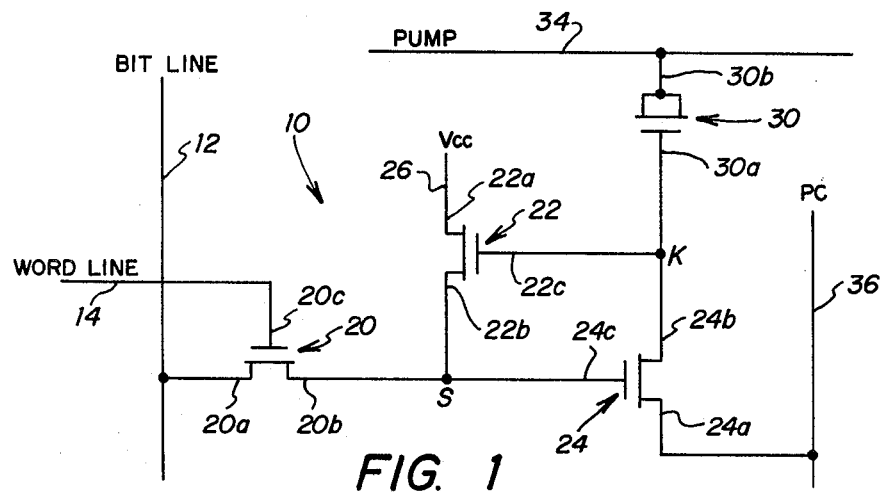
FIG. 1
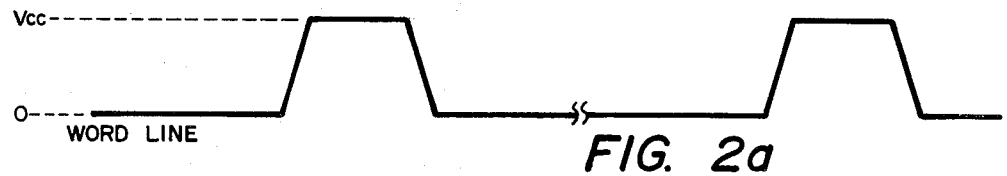
FIG. 2a
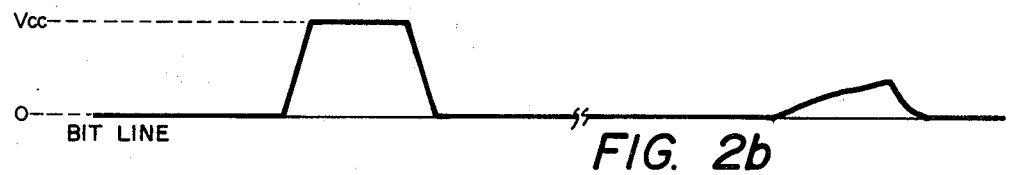
FIG. 2b
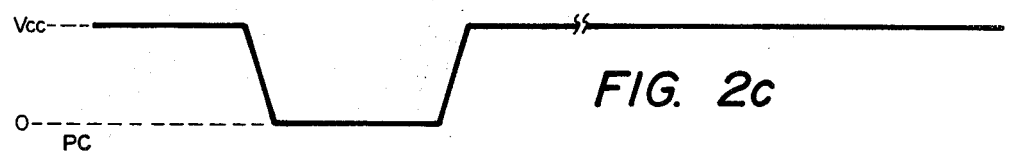
FIG. 2c
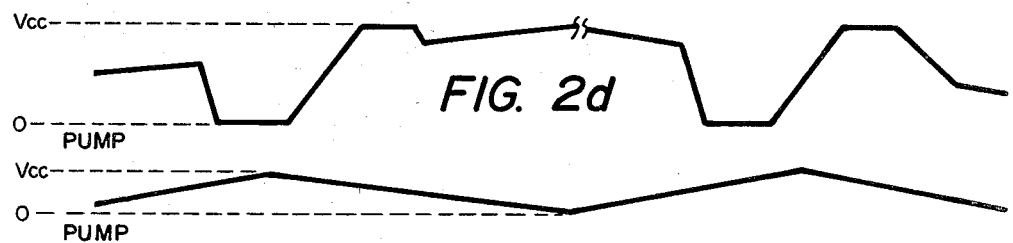
FIG. 2d
FIG. 2e

MOS MEMORY CELL

TECHNICAL FIELD

This invention relates to random access memories, and more particularly to a static MOS memory cell utilizing three transistors fabricated on a monolithic semiconductor chip.

BACKGROUND ART

Large scale integration techniques have brought about the construction of large arrays of binary storage elements on a single chip of silicon. These storage cells, typically using MOS technology, consist of multi-component circuits in a conventional bistable configuration. There are numerous advantages of such semiconductor storage devices including high packing density and low power requirements of such memory cells.

Numerous prior art static cells of an integrated circuit memory have been developed. A well known static memory cell circuit arrangement which utilizes six insulated gate MOS field-effect transistors is a cross-coupled inverter stage shown in U.S. Pat. No. 3,967,252 issued to Donnelly on June 29, 1976 and entitled "Sense Amp for Random Access Memory". In that arrangement, in an effort to minimize the area required for a given number of memory cells, there are two cross-coupled inverters comprising two load devices and four transistors, such that a single cell includes six transistors. In an attempt to further reduce the dimensions of the cell structure of integrated circuit memories and to provide improved performance and higher packing densities, a structural layout in which four transistors and two resistive elements has been developed and is described in U.S. Pat. No. 4,125,854 issued to McKenney et al on Nov. 14, 1978 and entitled "Symmetrical Cell Layout for Static RAM".

In order to further improve upon the layout area and power drain of static memory devices, pseudo-static random access memories have been proposed using a one-transistor, one-capacitor dynamic cell together with self-refreshing circuitry. A self-refreshing cell utilizing five transistors and dynamic sensing is described in a paper by Caywood et al entitled "A Novel 4K Static RAM with Submilliwatt Standby Power", *IEEE Transactions on Electron Devices*, Volume ED.-26, No. 6, June, 1979 at page 861. However, the high packing density desired in such memory cells cannot be achieved using five transistors. A charge pumping loop utilizing a two-device inverter is described in a paper by Cilingiroglu entitled "A Charge-Pumping-Loop Concept for Static MOS/RAM Cells", *IEEE Journal of Solid-State Circuits*, Vol. SC-14, No. 3, June, 1979, at page 599. Transistor and resistor charge pumping loops as described suffer in that the storage of a logic "1" is degraded and the control of cell resistor values is difficult. Since these pseudo-static cells are derived from the one-transistor, one-capacitor dynamic cell concept, their readout is inherently destructive and must be refreshed after each read. Therefore, pseudo-static cells are not truly compatible with fully static memory operation. Furthermore, since pseudo-static cells store information on a capacitor without a holding device, they are sensitive to alpha-particle induced errors.

A need has thus arisen for a static MOS memory cell in which the number and area of cell components are minimized to increase packing densities in semiconductor storage devices. A need has further arisen for a static memory cell which can be read in a nondestructive manner resulting in a fully static memory operation. Additionally, a need has arisen for a semiconductor storage device having low power requirements while operating at high speeds. A need has further arisen for a semiconductor storage device having improved alpha-particle immunity and in which fabrication controls are minimal.

DISCLOSURE OF THE INVENTION

In accordance with the present invention, a semiconductor storage device cell is provided for fabrication on a monolithic MOS semiconductor substrate which offers the advantages of small size, low power, static compatibility and good alpha-particle immunity.

In accordance with the present invention, an integrated circuit memory cell having bit and word lines and a cell voltage supply source is provided. The memory cell includes first and second clock lines. A first transistor is interconnected to the bit line and the word line for providing access to the memory cell. A second transistor is provided and is interconnected to the cell voltage supply source and to the first transistor thereby defining a first node. The second transistor provides a charging path for the cell voltage supply source to the first node. A nonlinear capacitor fabricated from a transistor is interconnected to the first clock line and the second transistor. The interconnection between the capacitor and the second transistor defines a second node. The capacitor provides voltage coupling between the first clock line and the second node for conditionally coupling a voltage from the first clock line to the second node to render voltage at the second node higher than the cell voltage supply source. A third transistor is interconnected to the first and second nodes and the second clock line. The third transistor provides a charging path between the second clock line and the second node for conditionally maintaining a voltage at the second node.

In accordance with another aspect of the present invention, an integrated circuit memory cell having word and bit signal lines and a cell voltage supply source is provided. The memory cell includes first, second and third switches each having first and second terminals and a control terminal. The cell further includes a nonlinear capacitor having a control and a first terminal. The control terminal of the first switch is connected to the word signal line. The first terminal of the first switch is connected to the bit signal line. The second terminal of the first switch is connected to the second terminal of the second switch and the control terminal of the third switch to thereby define a storage node for the memory cell. The first terminal of the second switch is connected to the cell voltage supply source. The control terminal of the second switch is connected to the second terminal of the third switch and the control terminal of the capacitor. The first terminal of the third switch is connected to a first control clock line and the first terminal of the capacitor is connected to a second control clock line.

BRIEF DESCRIPTION OF DRAWINGS

For a more complete understanding of the present invention and for further objects and advantages thereof, reference will now be made to the following Detailed Description taken in conjunction with the accompanying Drawings in which:

FIG. 1 is a schematic circuit diagram of the memory cell of the present invention;

FIG. 2 illustrates signal wave forms illustrating the operation of the present memory cell.

DETAILED DESCRIPTION

Figure 3:
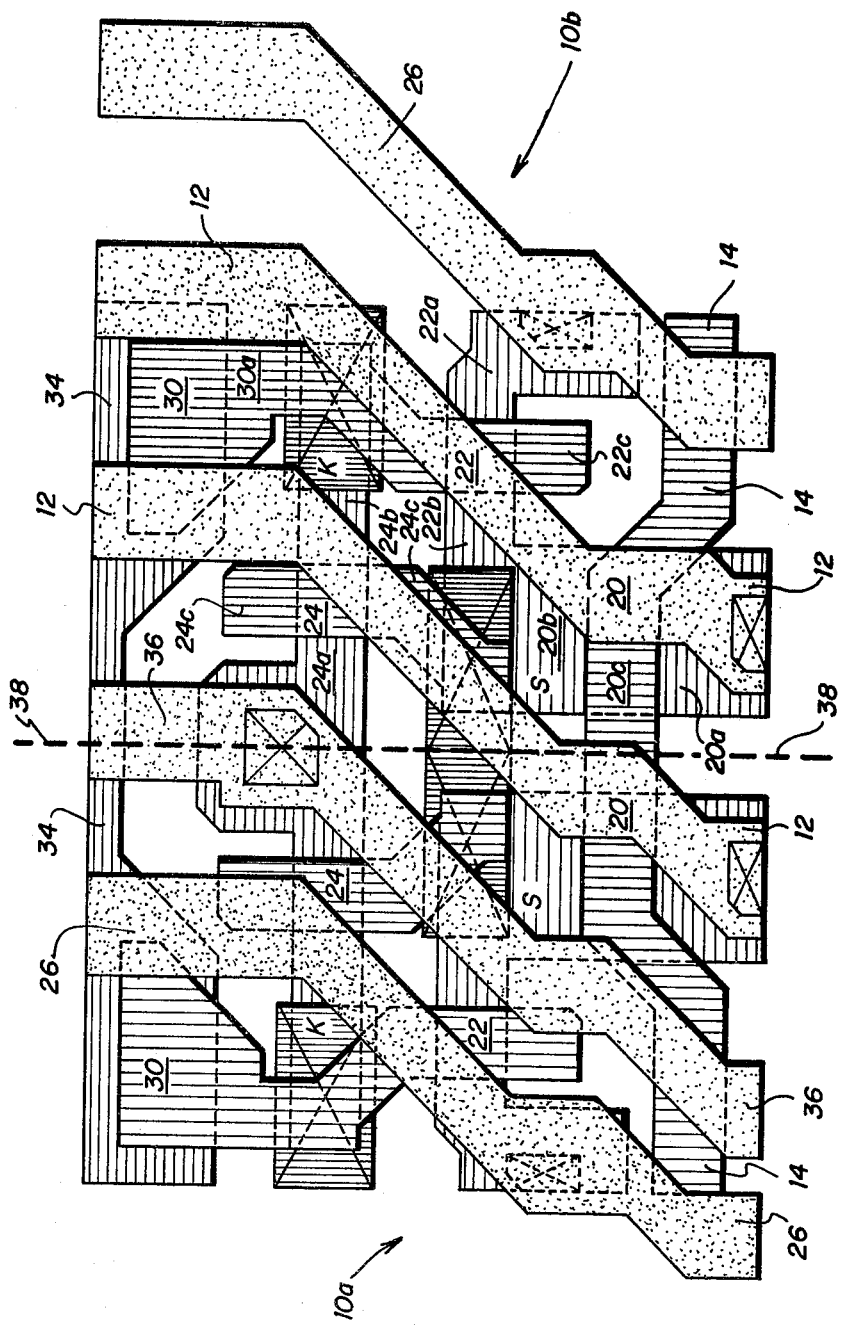
FIG. 3 is a layout design of the memory cell shown in FIG. 1.

Referring to FIG. 1, the integrated circuit memory cell of the present invention is illustrated and is generally identified by the numeral 10. Memory cell 10 is utilized as part of an array of numerous such cells arranged in rows and columns in a conventional manner to form a random access memory. The random access memory thereby formed using memory cell 10 may be fabricated on a single semiconductor chip and is primarily intended for such fabrication utilizing metal-oxide-semiconductor technology.

When arranged in an array of memory cells, memory cell 10 is disposed in columns and connected to a bit line 12. Since memory cells 10 are disposed in separate rows of a random access memory, the rows are addressed or enabled by separate word lines, such as word line 14. Word line 14 enables all the memory cells 10 in one row of a random access memory utilizing the present memory cell 10. Write control circuits (not shown) may be connected to drive bit line 12 during a write cycle. Enable circuitry (not shown) may be provided to connect bit line 12 to sense amplifiers.

Memory cell 10 includes three field-effect transistors generally identified by the numerals 20, 22 and 24. Transistor 20 includes terminals 20a, 20b and a control or gate terminal 20c. Transistor 22 includes terminals 22a, 22b and a control terminal 22c. Similarly, transistor 24 includes terminals 24a, 24b and a control terminal 24c. Terminal 20c of transistor 20 is connected to word line 14. Terminal 20a of transistor 20 is connected to bit line 12. Terminal 20b of transistor 20 and terminal 22b of transistor 22 are interconnected to terminal 24c of transistor 24 to define a cell storage node S. Terminal 22a of transistor 22 is connected to a cell voltage supply line 26 to receive the cell voltage $V_{cc}$.

Memory cell 10 further includes a nonlinear capacitor 30 having terminals 30a and 30b. Capacitor 30 is fabricated from an enhancement type field-effect transistor wherein the drain and source terminals are interconnected to form terminal 30b. The gate terminal of the field-effect transistor comprises terminal 30a of capacitor 30. Terminal 30b of capacitor 30 is interconnected to a clocked pump line 34. The voltage on clocked pump line 34 is a slow oscillating voltage which functions to refresh or replenish any charge leakage in memory cell 10 when data is stored in memory cell 10. Terminal 30a of capacitor 30, terminal 22c of transistor 22 and terminal 24b of transistor 24 are interconnected to form a node, K. A control clock line is provided for memory cell 10 and comprises a precharge, PC, control clock line 36 which is interconnected to terminal 24a of transistor 24. PC supply line 36 is normally held high to the value of $V_{cc}$.

Referring simultaneously to FIGS. 1 and 2, the operation of the present memory cell 10 will now be described. When word line 14 is high, representing a logic "1", memory cell be read or written. When word line 14 is low, representing a logic "0", memory cell 10 is isolated from bit line 12 and data can be stored at node S, such that memory cell 10 enters the standby mode of operation.

When a logic zero is stored at nodes S and K, transistor 22 is off to isolate node S from the cell voltage $V_{cc}$ and transistor 24 is off to isolate node K from precharge clock line 36. The diode to substrate junction leakage current within memory cell 10 is able to sustain a logic low on both nodes S and K. During this time, there is very little capacitance between terminals 30a and 30b of capacitor 30, such that the voltage at node K cannot be affected by the varying voltage on clocked pump line 34.

When a logic one is stored in memory cell 10, node S and node K hold each other high. A high coupling capacitance now exists between clocked pump line 34 and node K. Since, at this time, transistor 24 is cutoff, the ascending voltage variations on clocked pump line 34 couple very effectively to node K, thereby kicking the voltage at node K higher than the cell voltage supply value, $V_{cc}$. This coupling results in a highly conductive charging path from $V_{cc}$ through transistor 22 to pull up the voltage at node S thereby replenishing any charge loss due to leakages at node S. While the ascending voltage variations on clocked pump line 34 kick the voltage at node K high, the descending voltage variations on clocked pump line 34 cannot pull the node K voltage lower than a threshold below the voltage at node S because the voltage on PC control clock line 36 maintains the node K voltage through the conductive transistor 24. It is because of this cross-holding pattern between nodes S and K that memory cell 10 provides static storage ability as well as improved immunity against charge losses due to alpha-particle influences.

To perform a read operation to memory cell 10, bit line 12 is initially discharged to 0 and floating. When word line 14 goes high (FIG. 2a), bit line 12 will remain 0 and read out if a logic zero was stored at node S. Bit line 12 will be pulled high through operation of transistors 20 and 22 if a logic 1 was stored at node S, as illustrated in FIG. 2b, and a high will be read. It should be noted that the stored cell data has not been destroyed during the read operation. Hence it does not need dynamic sensing or refreshing techniques. Memory cell 10 can also be read through cell voltage supply line 26 by letting voltage supply line 26 float during a read operation.

To perform a write operation, precharge control clock line 36 will be brought low before word line 14 goes high as shown in FIG. 2c to allow node K to be discharged to zero. Data on bit line 12 is written into node S as word line 14 goes high. After data is written into node S, precharge control clock line 36 goes high, as shown in FIG. 2c. Node K will be charged to a value higher than the cell supply voltage if a logic 1 was written into node S.

The operation of clocked pump line 34 is illustrated in FIGS. 2d and 2e. The voltage waveform on clocked pump line 34, illustrated in FIG. 2d provides a refresh of the entire row of memory cells 10 as well as raises to a higher voltage at node K of the memory cell 10 being read, rendering transistor 22 highly conductive to obtain a fast read from memory cell 10.

FIG. 3 illustrates a layout design for memory cell 10 including two adjacently fabricated memory cells 10 wherein like numerals are utilized for like and corresponding components previously identified. The two memory cells 10 are identified by numerals 10a and 10b and are shown divided by the line 38. It can be seen that the precharge control clock line 36 is shared between memory cells 10a and 10b. This results in a natural by sight type memory organization. Word line 14 is a polysilicon line running in the X direction across memory cells 10a and 10b. Similarly, clocked pump line 34 is also disposed in the X direction with diffusion interconnected to capacitor 30. This structural arrangement allows the row address decoder utilized with memory cell 10 to generate the pumping wave forms during read/write cycle as shown in FIG. 2d. The arrangement of metal lines comprising bit line 12, cell voltage supply line 26 and precharge control clock line 36 are disposed diagonally in the Y direction with respect to clocked pump line 34 and word line 14 and comprise a metal pattern that repeats every two cells of memory cell 10. This configuration results in a compact cell layout for memory cell 10. A different layout design with straight metal bit line, cell voltage supply line and precharge control clock line also yields a smaller cell area than those of prior art static cells.

Memory cell 10 may be fabricated utilizing a single polysilicon N-channel MOS process as is well known in the art. If a double polysilicon process is utilized, word line 14, clocked pump line 34 and cell voltage supply line 26 can be metalized in the X direction while the second polysilicon lines interconnect in the Y direction. This process can reduce resistor-capacitor delays in the clocked pump line 34 and a smaller array size can be achieved when compared to previously developed memory cells.

It therefore can be seen that the present invention provides for a MOS memory cell in which the number of cell components are minimized providing a memory cell of small area. Furthermore, the memory cell of the present invention can be read out nondestructively, being compatible with fully static memory operations. Additionally, the memory cell of the present invention has enhanced operating characteristics utilizing a low frequency pump with read/write kicks to enhance the operating speed of the memory cell without consuming high power. Additionally, the memory cell of the present invention operates with improved alpha-particle immunity.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. An integrated circuit memory cell having bit and word lines and a cell voltage supply source comprising:
   first and second clock lines;
   first transistor means interconnected to the bit line and the word line for providing access to the memory cell;
   second transistor means interconnected to the cell voltage supply source and to said first transistor means thereby defining a first node, said second transistor means providing a charging path from the cell voltage supply source to said first node for conditionally maintaining a voltage at said first node;
   nonlinear capacitor means interconnected to said first clock line and said second transistor means, the interconnection between said capacitor means and said second transistor means thereby defining a second node, said capacitor means providing nonlinear capacitive coupling between said first clock line and said second node for conditionally supplying a voltage from said first clock line to said second node to render the voltage at said second node higher than the cell voltage supply source; and
   third transistor means interconnected to said first and second nodes and said second clock line, said third transistor means providing a charging path between said second clock line and said second node for conditionally maintaining a voltage at said second node.

2. The integrated circuit memory of claim 1 wherein said first node comprises a storage node of the memory cell for the storage of data.

3. The integrated circuit memory cell of claim 1 wherein said first clock line provides a slow oscillating voltage source to the memory cell.

4. The integrated circuit memory cell of claim 1 wherein said second clock line provides a voltage source to the memory cell approximately equal to the cell voltage supply source.

5. The integrated circuit memory of claim 1 wherein said nonlinear capacitor means provides said coupling path between said first clock line and said second node for storage and read of a high at said first node.

6. The integrated circuit memory of claim 1 wherein said third transistor means provides a charging path between said second clock line and said second node to maintain a voltage at said second node when a high is stored at said first node and provides a precharging path to said second node during a write operation.

7. The integrated circuit memory of claim 1 wherein said first clock line provides a refresh for the integrated circuit memory cell and kicks the voltage at said second node higher than the cell voltage supply source to obtain a high speed readout operation.

8. The integrated circuit memory of claim 1 wherein said second clock line provides a precharge for the integrated circuit memory during a write operation.

9. The integrated circuit memory of claim 1 wherein said second transistor provides a charging path between said cell voltage supply source and said first node to thereby maintain a high voltage when a logic high is stored in the integrated circuit memory cell.

10. An integrated circuit memory cell having word and bit signal lines and a cell voltage supply source comprising:
    first, second and third switch means each having first and second terminals and a control terminal;
    capacitor means having first and second terminals;
    first and second clock lines;
    said control terminal of said first switch means being connected to the word signal line;
    said first terminal of said first switch means being connected to the bit signal line, said second terminal of said first switch means being connected to said second terminal of said second switch means and to said control terminal of said third switch means thereby defining a storage node of the memory cell;
    said first terminal of said second switch means being connected to the cell voltage supply source;
    said control terminal of said second switch means being connected to said second terminal of said third switch means and to said first terminal of said capacitor means;
    said first terminal of said third switch means being connected to said first clock line; and
    said second terminal of said capacitor means being connected to said second clock line.

11. The integrated circuit memory cell of claim 10 wherein said first clock line comprises a precharge voltage source substantially equal to the cell voltage supply source.

12. The integrated circuit memory cell of claim 10 wherein said second clock line comprises an oscillating pump voltage supply source.

13. The integrated circuit memory cell of claim 10 wherein said switch means comprise MOS transistors.

14. The integrated circuit memory cell of claim 10 wherein said capacitor means comprises a MOS transistor having source and drain terminals interconnected to form said second terminal of said capacitor means.

* * * * *